United States Patent
Long

(10) Patent No.: US 11,573,917 B2
(45) Date of Patent: Feb. 7, 2023

(54) LOW LATENCY COMPUTING ARCHITECTURE

(71) Applicant: Liqid Inc., Broomfield, CO (US)

(72) Inventor: Christopher R. Long, Colorado Springs, CO (US)

(73) Assignee: Liqid Inc., Broomfield, CO (US)

( * ) Notice: Subject to any disclaimer, the term of this patent is extended or adjusted under 35 U.S.C. 154(b) by 35 days.

(21) Appl. No.: 17/320,870

(22) Filed: May 14, 2021

(65) Prior Publication Data

US 2022/0283974 A1    Sep. 8, 2022

Related U.S. Application Data

(60) Provisional application No. 63/156,750, filed on Mar. 4, 2021, provisional application No. 63/156,751, filed on Mar. 4, 2021, provisional application No. 63/156,749, filed on Mar. 4, 2021.

(51) Int. Cl.
*G06F 13/40* (2006.01)
*G06F 1/3215* (2019.01)
*G06F 1/3234* (2019.01)

(52) U.S. Cl.
CPC .......... *G06F 13/4022* (2013.01); *G06F 1/325* (2013.01); *G06F 1/3215* (2013.01); *G06F 13/4027* (2013.01); *G06F 13/4081* (2013.01)

(58) Field of Classification Search
CPC ............. G06F 13/4022; G06F 13/4027; G06F 13/4081; G06F 1/325; G06F 1/3215
See application file for complete search history.

(56) References Cited

U.S. PATENT DOCUMENTS

| 6,130,889 A | 10/2000 | Feldman et al. |
|---|---|---|
| 7,567,434 B1 | 7/2009 | Sivertsen |
| 8,756,360 B1 | 6/2014 | Richard |
| 9,223,737 B1 * | 12/2015 | Serebrin ............... G06F 13/404 |
| 9,668,371 B1 | 5/2017 | Strmiska et al. |
| 9,678,910 B2 | 6/2017 | Breakstone et al. |
| 9,870,333 B1 * | 1/2018 | Lam ...................... G06F 13/385 |

(Continued)

OTHER PUBLICATIONS

"GigaIO AIC Resource Box—Disaggregated Compute Accelerator for Deep Learning and HPC"; https://gigaio.com/wp-content/uploads/2020/09/GIO_AIC_ResourceBox.V2.0.pdf; Sep. 15, 2020; 1 page.

(Continued)

*Primary Examiner* — Nimesh G Patel

(57) ABSTRACT

Deployment of arrangements of physical computing components coupled over a communication fabric are presented herein. In one example, a method includes coupling into a communication fabric a plurality of communication interfaces provided by a baseboard hosting a plurality data processing devices. The method includes establishing a one-hop latency in the communication fabric between the plurality of data processing devices and peripheral card slots, and establishing a two-hop latency in the communication fabric between the plurality of data processing devices and additional peripheral card slots. The method also includes establishing interconnect pathways between a plurality of communication switches that provide the one-hop latency through one or more cross-connect communication switches that provide the two-hop latency.

20 Claims, 7 Drawing Sheets

(56) References Cited

U.S. PATENT DOCUMENTS

| | | | |
|---|---|---|---|
| 10,180,924 | B2 | 1/2019 | Breakstone et al. |
| 10,592,291 | B2 | 3/2020 | Breakstone et al. |
| 11,055,252 | B1 | 7/2021 | Constantinides et al. |
| 2004/0032961 | A1 | 2/2004 | Terada et al. |
| 2005/0220148 | A1 | 10/2005 | Delregno et al. |
| 2007/0136504 | A1 | 6/2007 | Wu |
| 2009/0022304 | A1 | 1/2009 | Kubler et al. |
| 2009/0164687 | A1 | 6/2009 | Zhu |
| 2009/0172236 | A1 | 7/2009 | Sun |
| 2011/0252249 | A1 | 10/2011 | Wang et al. |
| 2013/0031288 | A1* | 1/2013 | Richard ............... G06F 13/409 710/301 |
| 2014/0365698 | A1* | 12/2014 | Richard ............... G06F 13/409 710/316 |
| 2015/0261710 | A1 | 9/2015 | Billi |
| 2015/0309952 | A1 | 10/2015 | Breakstone et al. |
| 2015/0370665 | A1 | 12/2015 | Cannata et al. |
| 2015/0370742 | A1 | 12/2015 | Breakstone et al. |
| 2015/0373115 | A1 | 12/2015 | Breakstone et al. |
| 2016/0321012 | A1 | 11/2016 | Clark et al. |
| 2016/0352651 | A1 | 12/2016 | Egi et al. |
| 2017/0046293 | A1* | 2/2017 | Lasater ............... G06F 13/4282 |
| 2017/0134223 | A1 | 5/2017 | Ahmed et al. |
| 2017/0150621 | A1 | 5/2017 | Breakstone et al. |
| 2017/0228339 | A1 | 8/2017 | Shao et al. |
| 2018/0101500 | A1 | 4/2018 | Heyd et al. |
| 2018/0260352 | A1 | 9/2018 | Long et al. |
| 2018/0314667 | A1 | 11/2018 | Long et al. |
| 2019/0306083 | A1 | 10/2019 | Shih et al. |
| 2020/0045843 | A1 | 2/2020 | Schramm et al. |
| 2021/0004342 | A1 | 1/2021 | Singer et al. |
| 2021/0100127 | A1* | 4/2021 | Farrahi Moghaddam ................... H05K 7/1492 |

OTHER PUBLICATIONS

"GigaIO Gen4 Accelerator Pooling Appliance—Fully Managed Disaggregated Compute Accelerator Appliance for AI/DL, HPC, Visualization and Data Science Applications"; https://gigaio.com/wp-content/uploads/2020/11/Hydra-V11.0.pdf; Nov. 16, 2020; 2 pages.

International Search Report and Written Opinion for PCT Application No. PCT/US2022/017259, dated May 3, 2022 16 pages.

Mullins, et al. "The design and implementation of a low-latency on-chip network." Asia and South pacific Conference on Design Automation, 2006; IEEE; Jan. 27, 2006. (Abstract only; 3 pages).

International Search Report and Written Opinion for PCT Application No. PCT/US2022/017265, dated Jun. 21, 2022; 12 pages.

International Search Report and Written Opinion for PCT Application No. PCT/US2022/017004, dated Jun. 9, 2022; 7 pages.

* cited by examiner

LOW LATENCY COMPUTING ARCHITECTURE

RELATED APPLICATIONS

This application claims the benefit of and priority to U.S. Provisional Patent Application 63/156,750, titled "HIGH PERFORMANCE COMPUTING SYSTEM," filed Mar. 4, 2021, which is hereby incorporated by reference in its entirety. This application also claims the benefit of and priority to U.S. Provisional Patent Application 63/156,749, titled "GPU SWITCH CHASSIS," filed Mar. 4, 2021, which is hereby incorporated by reference in its entirety. This application also claims the benefit of and priority to U.S. Provisional Patent Application 63/156,751, titled "POWER CONTROL FOR PCIE SLOTS," filed Mar. 4, 2021, which is hereby incorporated by reference in its entirety.

BACKGROUND

Clustered computing systems have become popular as demand for data storage, data processing, and communication handling has increased. Data centers typically include large rack-mounted and network-coupled data storage and data processing systems. These data centers can receive data for storage from external users over network links, as well as receive data as generated from applications that are executed upon processing elements within the data center. Many times, data centers and associated computing equipment can be employed to execute jobs for multiple concurrent users or applications. The jobs include execution jobs which can utilize resources of a data center to process data using central processing units (CPUs) or graphics processing units (GPUs), as well as to route data associated with these resources between temporary and long-term storage, or among various network locations.

GPU-based processing has increased in popularity for use in artificial intelligence (AI) and machine learning regimes. In these regimes, computing systems, such as blade servers, can include one or more GPUs along with associated CPUs for processing of large data sets. Some high performance platforms have been deployed, such as the A100 baseboard card (HGX) from Nvidia, which offers "tensor core" GPU-based compute capabilities to perform AI operations. However, the A100 and other similar platforms lack flexibility and access to sufficient amounts of data storage without incurring large latencies in conventional memory hierarchies. Thus, large AI datasets are typically cached local to the AI processor and swapped frequently to other data storage tiers to handle large datasets. This swapping process creates slowdowns and operational bottlenecks, limiting performance of AI processing platforms and other high-performance computing platforms.

OVERVIEW

Deployment of arrangements of physical computing components coupled over a communication fabric are presented herein. In one example, a method includes coupling into a communication fabric a plurality of communication interfaces provided by a baseboard hosting a plurality data processing devices. The method includes establishing a one-hop latency in the communication fabric between the plurality of data processing devices and peripheral card slots, and establishing a two-hop latency in the communication fabric between the plurality of data processing devices and additional peripheral card slots. The method also includes establishing interconnect pathways between a plurality of communication switches that provide the one-hop latency through one or more cross-connect communication switches that provide the two-hop latency.

In another example, a system includes a communication fabric configured to couple to a plurality of communication interfaces provided by a baseboard hosting a plurality data processing devices. The system also includes a one-hop latency established in the communication fabric between the plurality of data processing devices and peripheral card slots, and a two-hop latency established in the communication fabric between the plurality of data processing devices and additional peripheral card slots. Interconnect pathways are established between a plurality of communication switches that provide the one-hop latency through one or more cross-connect communication switches that provide the two-hop latency.

In another example, a computing arrangement includes a Peripheral Component Interconnect Express (PCIe) fabric configured to provide a one-hop latency between a first plurality of PCIe interfaces and a second plurality of PCIe interfaces. The PCIe fabric is configured to provide a two-hop latency between the first plurality of PCIe interfaces and a third plurality of PCIe interfaces, wherein interconnect pathways are established between PCIe switches that provide the one-hop latency through one or more cross-connect PCIe switches that provide the two-hop latency. The computing arrangement also includes a control arrangement for the PCIe fabric configured to establish groupings among selected ones of the first plurality of PCIe interfaces, the second plurality of PCIe interfaces, and the third plurality of PCIe interfaces, wherein the groupings form compute units each having PCIe communications segregated within the PCIe fabric from each other.

This Overview is provided to introduce a selection of concepts in a simplified form that are further described below in the Technical Disclosure. It should be understood that this Overview is not intended to identify key features or essential features of the claimed subject matter, nor should it be used to limit the scope of the claimed subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
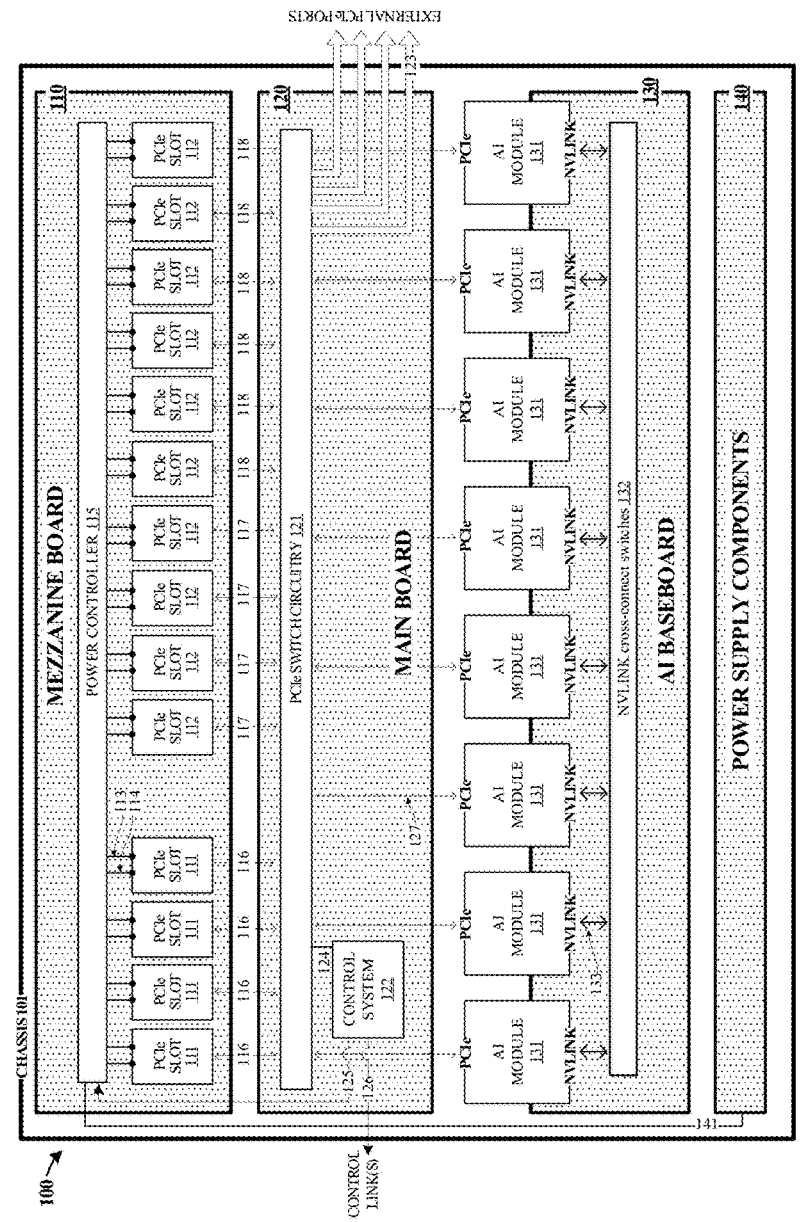
FIG. 1 is a diagram illustrating a computing system in an implementation.

Data processing has increased in popularity for use in artificial intelligence (AI) and machine learning regimes. In these regimes, computing systems can include one or more GPUs along with associated CPUs for processing of large data sets. The examples herein provide for enhanced data and peripheral systems for AI processing that can access large datasets (i.e. 256 TB or more) with only 1 to 2 hops of latency away from the data processing elements. Additionally, the examples herein offer the flexibility to share results of the datasets between graphics processing units (GPUs) through RAM or solid-state storage based technology on a communication bus. Flexibility is provided to change configurations/peripherals with more resources (from GPUs to PCIe or InfiniBand) by adding peripheral cards through live insertion of new devices or swapping peripheral cards out without powering down the data processing system.

Moreover, composability can be established for AI systems, such as the Nvidia A100 system. Composability refers to the ability to disaggregate computing components from each other and form new arrangements among physical computing components using a flexible logical partitioning in a communication fabric (e.g. PCIe fabric). With this, compute units can be formed from a pool of available computing components dynamically, with corresponding physical computing components returned to the pool for forming other compute units. Physical computing components can include central processing units (CPUs) along with various types of co-processing units (CoPUs), such as graphics processing units (GPUs), tensor processing units (TPUs), field-programmable gate arrays (FPGAs), or application-specific integrated circuits (ASICs). Co-processing unit types of processing have increased in popularity for use in AI and machine learning systems.

In the examples herein, limitations of AI data systems can be overcome using disaggregated computing systems which can dynamically compose groupings of computing on-the-fly according to the needs of each incoming execution job. These groupings, referred to herein as compute units, compute nodes, or bare metal machines, can include resources which meet the needs of the various execution jobs and are tailored to such jobs. Instead of having a fixed arrangement between a CPU, CoPU, network, and storage elements, which are housed in a common enclosure or chassis, the examples herein can flexibly include any number of CPUs, CoPUs, and storage elements that span any number of enclosures/chassis and which are dynamically formed into logical arrangements over a communication fabric. The compute units are composed from among computing components that form a pool of computing components. Logical partitioning is established within the communication fabric to form the compute units and isolate each compute unit from each other. Compute units can later be decomposed back into the pool of computing components. Compute units can be further grouped into sets or clusters of many compute units/machines to achieve greater parallelism and throughput. Thus, a data system can better utilize resources by not having idle or wasted portions of a blade server which are not needed for a particular job or for a particular part of a job. A data center operator can achieve very high utilization levels for a data center, greater than can be achieved using fixed-arrangement servers.

Arrangements of physical computing components coupled over a communication fabric can be achieved by populating various peripheral card slots in a chassis with add-in cards that house such computing components. Various expansion ports are also included which allow coupling to further chassis and components. These cards and ports can be further coupled over the communication fabric to a baseboard which houses a plurality of CoPU/GPU devices which have separate cross-coupling on the baseboard. The components of the various computing systems herein can be included in one or more physical enclosures, such as rack-mountable modules which can further be included in shelving or rack units. A quantity of components can be inserted or installed into a physical enclosure, such as a modular framework where modules can be inserted and removed according to the needs of a particular end user. An enclosed modular system can include physical support structure and enclosure that includes circuitry, printed circuit boards, semiconductor systems, and structural elements. The modules that comprise the components of such as computing system may be insertable and removable from a rackmount style or rack unit (U) type of enclosure. It should be understood that the components can be included in any physical mounting environment, and need not include any associated enclosures or rackmount elements.

Discussed herein are various individual physical computing components coupled over one or more shared communication fabrics. Although the examples below employ PCIe as the exemplary communication fabric type, it should be understood that others can instead be used. PCIe is a high-speed serial computer expansion bus standard, and typically has point-to-point connections among hosts and component devices, or among peer devices. PCIe typically has individual serial links connecting every device to a root complex, also referred to as a host. A PCIe communication fabric can be established using various switching circuitry and control architectures described herein. A Peripheral Component Interconnect Express (PCIe) fabric might comprise various implementation versions, such as 3.0, 4.0, or 5.0, among others. Some additional signaling or protocol types are built upon PCIe, and thus add additional features to PCIe interfaces.

Instead of a PCIe fabric, other point-to-point communication fabrics or communication buses with associated physical layers, electrical signaling, protocols, and layered communication stacks can be employed. These might include Gen-Z, Ethernet, InfiniBand, NVMe, Internet Protocol (IP), Serial Attached SCSI (SAS), FibreChannel, Thunderbolt, Serial Attached ATA Express (SATA Express), Cache Coherent Interconnect for Accelerators (CCIX), Compute Express Link (CXL), Open Coherent Accelerator Processor Interface (OpenCAPI), wireless Ethernet or Wi-Fi (802.11x), or cellular wireless technologies, among others. Ethernet can refer to any of the various network communication protocol standards and bandwidths available, such as 10BASE-T, 100BASE-TX, 1000BASE-T, 10GBASE-T (10 GB Ethernet), 40GBASE-T (40 GB Ethernet), gigabit (GbE), terabit (TbE), 200 GbE, 400 GbE, 800 GbE, or other various wired and wireless Ethernet formats and speeds. Cellular wireless technologies might include various wireless protocols and networks built around the 3rd Generation Partnership Project (3GPP) standards including 4G Long-Term Evolution (LTE), 5G NR (New Radio) and related 5G standards, among others. Parallel, serial, or combined parallel/serial types of interfaces can also apply to the examples herein.

As a first example system, FIG. 1 is presented. FIG. 1 is a system diagram illustrating computing system 100. Computing system 100 includes chassis 101 having physical computing components coupled over a communication fabric. Computing system 100 includes several circuit boards which have various components, namely mezzanine board 110, main board 120, and AI baseboard 130. In addition, various support circuitry, structural support elements, enclosure elements, and power supply components 140 are included in chassis 101. It should be understood that a different configuration or arrangement of circuit boards and chassis component can be employed. Chassis 101 might be a rackmount structure which includes the various components shown in FIG. 1, having an enclosure and various ports for connecting to other equipment external to the enclosure. Thus, computing system 100 can provide for a high-speed, low-latency peripheral connection arrangement for AI baseboard 130.

The communication fabric of FIG. 1 is formed from among a plurality of PCIe switching elements, indicated by PCIe switch circuitry 121 on main board 120. A two layer arrangement of PCIe switches is formed, advantageously providing for one- or two-hop latencies for any of AI modules 131 found on AI baseboard 130. A first layer provides one-hop latency, while a second layer provides two-hop latency. A 'hop' in this context refers to a quantity of PCIe switches which must be traversed by associated traffic to reach a destination/endpoint. FIG. 1 also includes a set of PCIe peripheral card slots 111 and 112 which can provide one- or two-hop latency to any of AI modules 131, and set of PCIe expansion ports 123 which can provide one-hop latency to external hosts. Thus, an external host, such as a CPU not included in computing system 100 coupled over external PCIe ports 123, can achieve one-hop latency to resources of computing system 100, such as certain PCIe slots or AI modules 131. These external hosts might couple into computing system 100 using native PCIe, NVMe protocols over PCIe, or connect over InfiniBand (IB) provided by an expansion card in one of the PCIe slots. Moreover, any of AI modules 131 can achieve one-hop latency to certain PCIe peripheral card slots which might be fitted with data storage or random-access memory (RAM) devices. As these PCIe slots include sixteen (16) lanes (e.g. x16), a substantial quantity of data storage/memory resources can be made available to any of AI modules 131. This can provide several advantages when large memory devices or storage devices are populated into such PCIe peripheral card slots. Traditional systems employ cascaded arrangements of PCIe switching elements, which only provide two- or more levels of latency, adding significantly to delays in transferring data among various connected elements.

As will be discussed, some of the PCIe slots are included on the first layer of latency, while others of the PCIe slots are included on the second layer of latency. This allows an operator to select which PCIe slot is appropriate to the expansion or peripheral card to give desired latency performance. A first 'tier' of data storage or memory can include 256 terabytes (TB) of data storage or 24 TB of RAM. A second 'tier' of data storage or memory can provide an additional 192 TB of data storage, or larger sets using external expansion ports to additional external storage units.

Returning to a discussion on the various boards included in FIG. 1, mezzanine board 110 comprises one or more circuit boards populated with electrical components, interconnect, and a plurality of PCIe slots 111-112. In this example, a first portion of PCIe slots are provided from a first set of PCIe switches, comprising a first layer of latency, and a second portion of PCIe slots are provided from PCIe switches which are mixed among the first layer and second layer of latency. Thus, fourteen (14) PCIe slots are provide in total, each having a x16 data width. Mezzanine board 110 also comprises power controller 115 which provides for power filtering, conversion, distribution, switching, and control for each of the 14 PCIe slots. This power includes power provided over the PCIe slot connections (e.g. 3.3V and 12V), as well as power provided over auxiliary power connections to peripheral cards (e.g. 12V) which require additional power. power controller 115 provides for individually powering on/off of PCIe slots so that individual peripheral cards can be removed or swapped while others remain powered and functional. In this manner, a powered-on and 'booted' system can have one or more PCIe cards swapped out to provide robust failure recovery for failed cards or to perform in-situ expansion of components/capacities. Indicator lights are provided for each PCIe slot which provide visual indicators of status, failure, operational mode, power status, or other information to an operator.

Main board 120 comprises one or more circuit boards populated with electrical components. These components form a PCIe fabric and various interconnect with other circuit boards of chassis 101. The PCIe fabric comprises a plurality of PCIe switches indicated by PCIe switch circuitry 121 as well as various control elements. Among these control elements is control system 122 which controls PCIe switch circuitry 121, provides control access to external agents to control system 122 and PCIe switch circuitry 121, and also provides various fabric management functions to compose/decompose logical arrangements within the PCIe fabric. Control system 122 also includes a fabric control interface comprising a communication link between control system 122 and any component coupled to the associated communication fabric(s), which may comprise one or more PCIe links. In some examples, the fabric interface may employ Ethernet traffic transported over a PCIe link or other link. The fabric control interfaces can be arranged into one or more control planes each having different communication architectures and protocols to allow operations and users to interface with controller elements and control the PCIe fabric. Moreover, control system 122 obtains and indicates telemetry data to external entities.

Control system 122 can comprise one or more microprocessors and other processing circuitry that retrieves and executes software, such as job interfaces and fabric management software, from an associated storage system (not shown). Control system 122 can be implemented within a single processing device but can also be distributed across multiple processing devices or sub-systems that cooperate in executing program instructions. Examples of control system 122 include general purpose central processing units, application specific processors, and logic devices, as well as any other type of processing device, combinations, or variations thereof. In some examples, control system 122 comprises an Intel® microprocessor, Apple® microprocessor, AMD® microprocessor, ARM® microprocessor, field-programmable gate array (FPGA), application specific integrated circuit (ASIC), application specific processor, or other microprocessor or processing elements.

AI baseboard 130 comprises one or more circuit boards that house a plurality of AI modules 131. Each AI module can be a separate circuit card or module which is inserted into a socket or slot. In some examples, AI baseboard 130 comprises an Nvidia A100 having GPU-based AI processing modules cross connected via one or more NVSwitch elements. This arrangement is illustrated by NVLink cross-connect switches 132 which comprises a plurality of NVLink cross-connect switching elements.

Power supply components 140 comprises various power conversion, power handling, filtering, and regulation circuitry. Power supply components 140 typically converts an input or source voltage to a working voltage level for components in chassis 101, as well as provides for surge protection, short circuit protection, polarity protection, and other forms of protection and interference mitigation. Moreover, power supply components 140 can include thermal handling components to remove heat from chassis 101, such as fans, cooling units, chillers, air conditioning elements, or other similar components. Redundancy is typically included in power supply components 140 to provide for continuous operation and power supply stability over various failures in equipment within power supply components 140.

In addition to the components for each circuit board discussed above in chassis 101, further components can be included, such as control circuitry, telemetry agents and components, glue logic, interconnect, on-board and inter-board connectors, sockets, power supply and conversion equipment/circuitry, mechanical structural elements and supporting members, heating/cooling components, fans, sub-enclosures, as well as other equipment and circuitry.

In operation, software and data sets can be deployed for processing by AI modules 131. Typically, AI modules 131 each act as co-processing modules, such as GPU-style modules, which still employ use of a general-purpose processor (e.g. CPU) to facilitate data set handling by AI modules 131 and to shift data to and from AI modules 131. In other example, AI modules 131 might have general-purpose processing capability to run operating systems or user application software, or AI baseboard 130 can include general-purpose processor element (e.g. CPU elements) for such tasks. However, by use of AI baseboard 130 within chassis 101 and computing system 100, further enhanced arrangements are possible. First, CPU elements can be included in any of PCIe slots 111-112. Additionally, network interface cards (NICs), GPUs, FPGAs, storage drives, further co-processing elements, or any PCIe-compatible devices can be populated into peripheral add-in cards in PCIe slots 111-112. Using these physical computing components (CPU, GPU, NIC, storage, or other devices) in concert with one or more AI module 131, computing arrangements can be formed, referred to herein as compute units, which are segregated within the PCIe fabric from one another. These form individual computers or servers which can be reconfigured on-the-fly to have a different arrangement of physical components or different quantity of physical components. Pools of physical computing components can be formed from the physical computing component populated into PCIe slots 111-112, as well as in other chassis or systems coupled over one or more of external PCIe links 123.

A PCIe fabric is formed from a plurality of PCIe switches included in PCIe switch circuitry 121, which may be referred to as PCIe cross-point switches. PCIe switch circuitry can be configured to logically interconnect various PCIe links based at least on the traffic carried by each PCIe link. In these examples, a domain-based PCIe signaling distribution can be included which allows segregation of PCIe ports of a PCIe switch according to operator-defined groups. The operator-defined groups can be managed by control system 122 which logically assembles physical computing components into associated compute units and logically isolates physical computing components among different compute units. Control system 122 can control PCIe switch circuitry over a fabric interface (e.g. link(s) 124) coupled to the PCIe fabric, and alter the logical partitioning or segregation among PCIe ports and thus alter composition of groupings of the physical components. In addition to, or alternatively from the domain-based segregation, each PCIe switch port can be a non-transparent (NT) port or transparent port. An NT port can allow some logical isolation between endpoints, much like a bridge, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port. Advantageously, this domain-based segregation (NT port-based segregation) can allow physical components (i.e. CPUs, CoPUs, storage units, FPGAs, NICs) to be coupled to a shared fabric or common fabric but only to have present visibility to those components that are included via the segregation/partitioning into a compute unit. Thus, groupings among a plurality of physical components can be achieved using logical partitioning among the PCIe fabric. This partitioning is scalable in nature, and can be dynamically altered as-needed by control system 122 or other control elements.

The systems and operations discussed herein provide for dynamic assignment of physical computing components, such as CPUs, GPUs, NICs, FPGAs, or storage resources to a computing cluster comprising compute units. The compute units are disaggregated and reside in a pool of unused, unallocated, or free components until allocated (composed) into compute units. A management entity, such as control system 122, can control composition and de-composition of the compute units and provide interfaces to external users, job management software, or orchestration software. Physical computing components can be swapped in and out of compute units and associated clusters on-the-fly, and these resources can be assigned to other compute units or clusters. In one example, AI modules or GPUs can be dispatched/orchestrated for a first computing resource/CPU and subsequently provide graphics processing status/results to another compute unit/CPU. In another example, when resources experience failures, hangs, overloaded conditions, then additional resources can be introduced into the compute units and clusters to supplement the resources.

Various triggers can be employed to modify or alter compute units after formation. In a first trigger, an event-based trigger is employed. These event-based triggers can alter or modify a compute unit or add additional compute units to support jobs or work units that comprise jobs. Based on observations by control system 122 of dynamic events or patterns exhibited by jobs, control system 122 can initiate changes to the configurations of compute units and resources assigned thereto. Examples of such events or patterns include observed resource shortages for a process, a specific string being identified by a function, a specific signal identified by an intelligent infrastructure algorithm, or other factors which can be monitored by control system 122. Telemetry of the executing jobs or analysis of the properties of the jobs prior to or during execution can inform control system 122 to initiate dynamic changes to the compute units. Thus, control system 122 can alter composition of compute units to add or remove resources (e.g. physical computing components) for the compute units according to the events or patterns. Advantageously, the compute units can be better optimized to support present resource needs of each job, while providing for resources to be intelligently returned to a pool when unneeded by present jobs or for use by other upcoming jobs.

Another alternative trigger includes temporal triggers based on machine learning type of algorithms or user-defined timeframes. In this example, patterns or behaviors of composed compute units can be determined or learned over time such that particular types of jobs exhibit particular types of behaviors. Based on these behaviors, changes to compute units can be made dynamically to support workload patterns. For example, control system 122 might determine that at certain phases of execution of particular types of jobs that more/less storage resources are needed, or more/less co-processing resources are needed. Control system 122 can predictively or preemptively alter the composition of a compute unit, which may include addition or removal or resources, to better optimize the current resources assigned to a compute unit with the work units being executed by a job. Temporal properties can be determined by control system 122 based on explicit user input or based on machine learning processes to determine timeframes to add or remove resources from compute units. Control system 122 can include resource scheduler elements which can determine what resource changes are needed and when these changes are desired to support current and future job needs. The changes to the compute units discussed herein may require re-composition and re-starting of the compute units and associated operating systems in some examples, such as when adding or removing certain physical components or resources. However, other changes, such as adding/removing storage or network interface resources might be accomplished on-the-fly without re-staring or re-composition of a particular compute unit.

Figure 2:
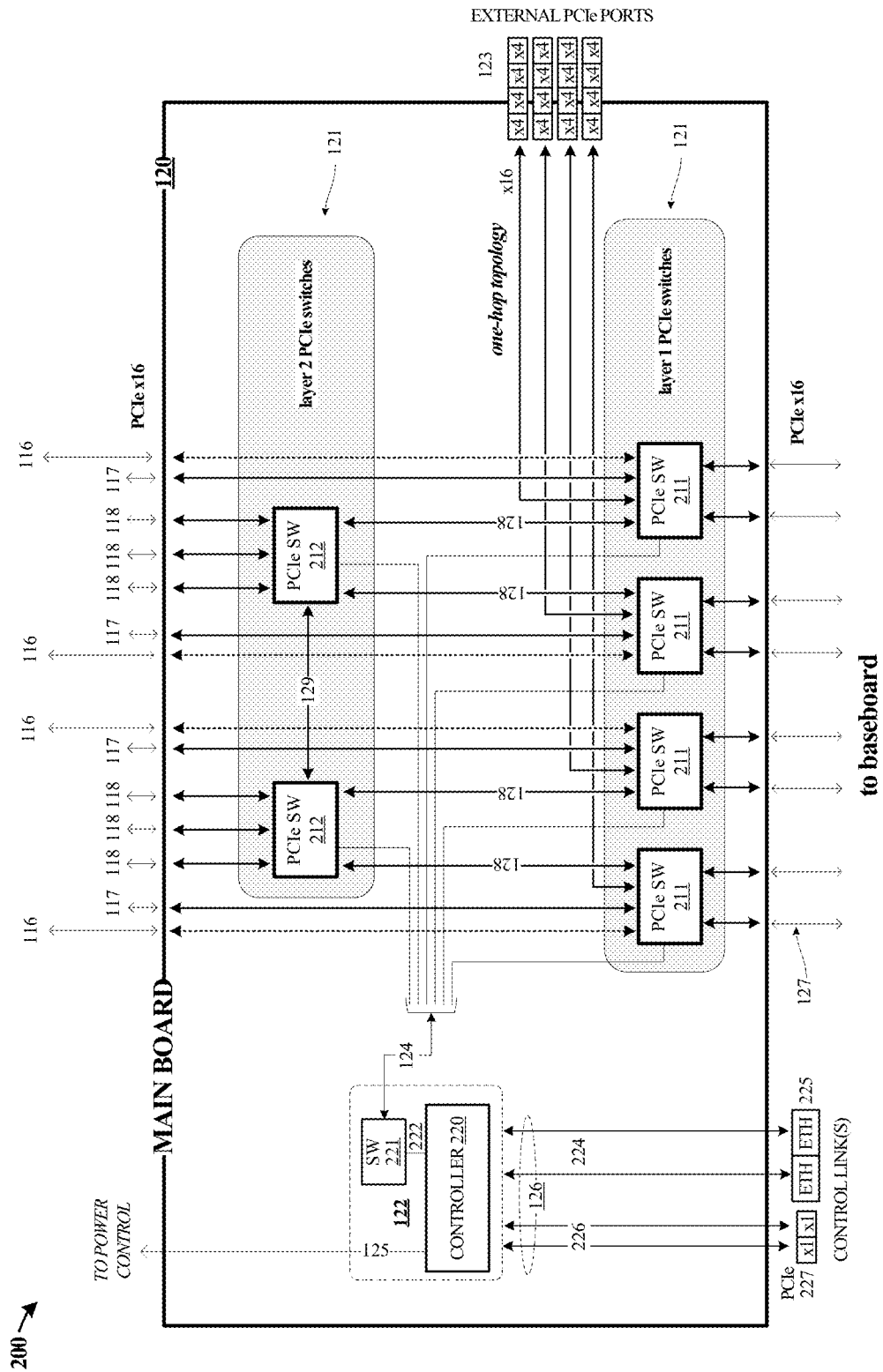
FIG. 2 is a diagram illustrating a main circuit assembly in an implementation.

Turning now to a discussion on elements of main board 120, FIG. 2 is presented. FIG. 2 illustrates main board 120 in configuration 200. Although main board 120 of FIG. 1 is referenced for illustrative purposes, it should be understood that other configurations and arrangements of the associated circuitry can be employed. Main board 120 includes PCIe switch circuitry 121, control system 122, and several external ports/links. The elements of main board 120 comprise a PCIe-based communication fabric, with PCIe switches 211-212 being controlled by control system 122 over link(s) 124 to provide various logical segregations or partitions among PCIe links/ports. In some examples, PCIe switches 211-212 comprise PLX/Broadcom/Avago PEX series chips, such as PEX8796 24-port, 96 lane PCIe switch chips, PEX8725 10-port, 24 lane PCIe switch chips, PEX97xx chips, PEX9797 chips, or other PEX87xx/PEX97xx chips.

In addition, a two-layer PCIe arrangement is noted in FIG. 2. A first layer (layer 1) of PCIe switches 211 provides one-hop latency to devices coupled over PCIe links 127 and to devices coupled over PCIe links 116-117. A second layer (layer 2) of PCIe switches provides two-hop latency to devices coupled over PCIe links 118. PCIe links 117-118 are coupled to PCIe expansion slots on mezzanine board 110, and PCIe links 127 are coupled to AI modules 131 on AI baseboard 130. In addition, layer 1 PCIe switches 211 provide a plurality of external PCIe ports 123 for coupling to other PCIe devices, hosts, or management entities external to chassis 101. Layer 1 PCIe switches 211 are coupled over PCIe links 128 to layer 2 PCIe switches 212. Layer 2 PCIe switches 212 are coupled over PCIe links 129 to each other. Links 128 and 129 establish interconnect pathways between layer 1 PCIe switches 211 (which provide the one-hop latency) through one or more cross-connect communication switches (layer 2 PCIe switches 212) that provide the two-hop latency. Logical arrangements can be formed among any selected PCIe links and corresponding devices, which typically includes one PCIe root complex associated with a host device (e.g. CPU). This PCIe host device can be included in PCIe expansion slots on mezzanine board 110 or coupled over any of external PCIe ports 123. It should be noted that the width or quantity of PCIe traffic lanes is indicated in FIG. 2 (and other Figures herein) by x16 for sixteen-lane PCIe links, x4 for four-lane PCIe links, and x1 for one-lane PCIe links. Other widths and configurations are possible.

Figure 4:
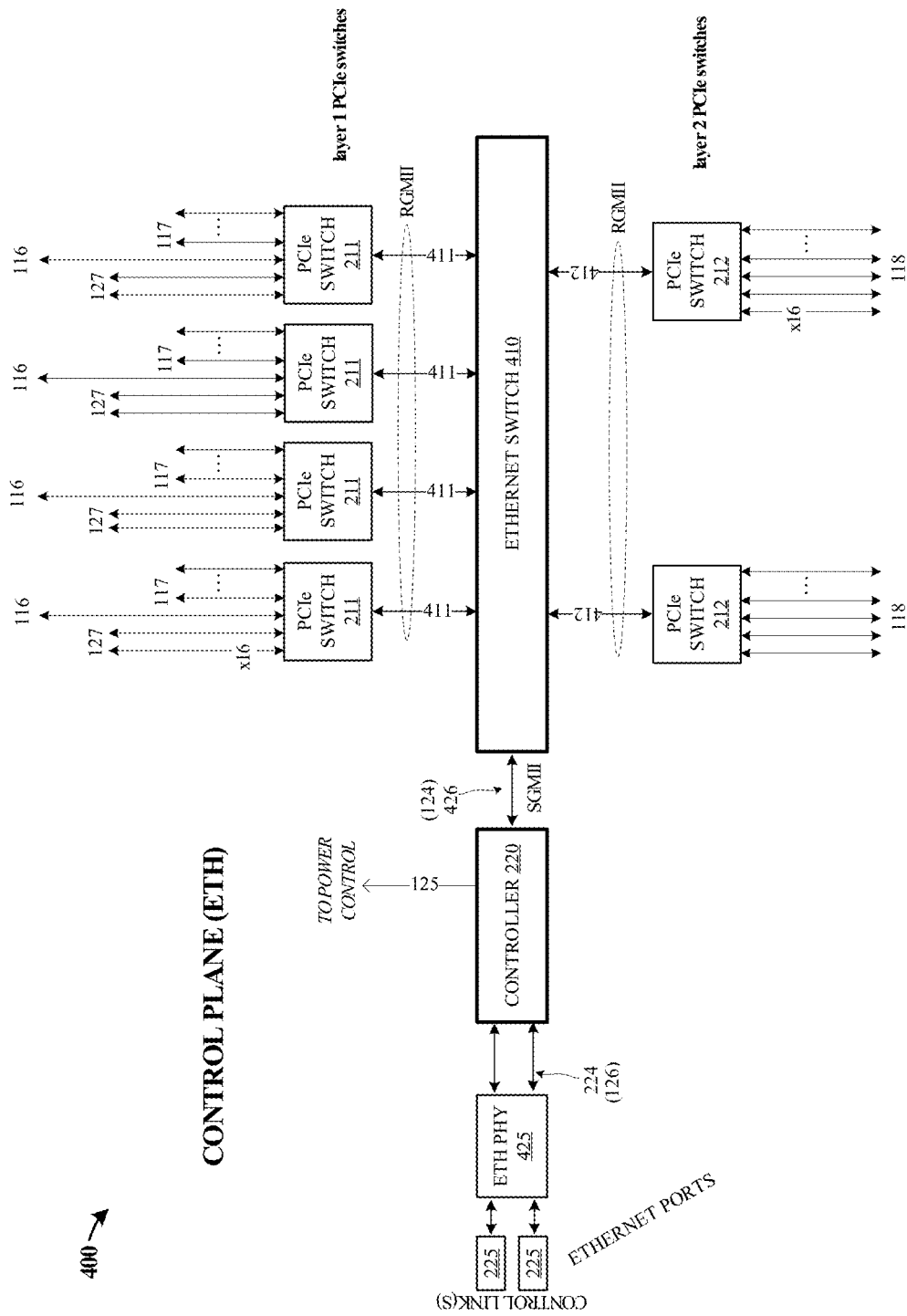
FIG. 4 is a diagram illustrating a control plane for a communication fabric in an implementation.
Figure 5:
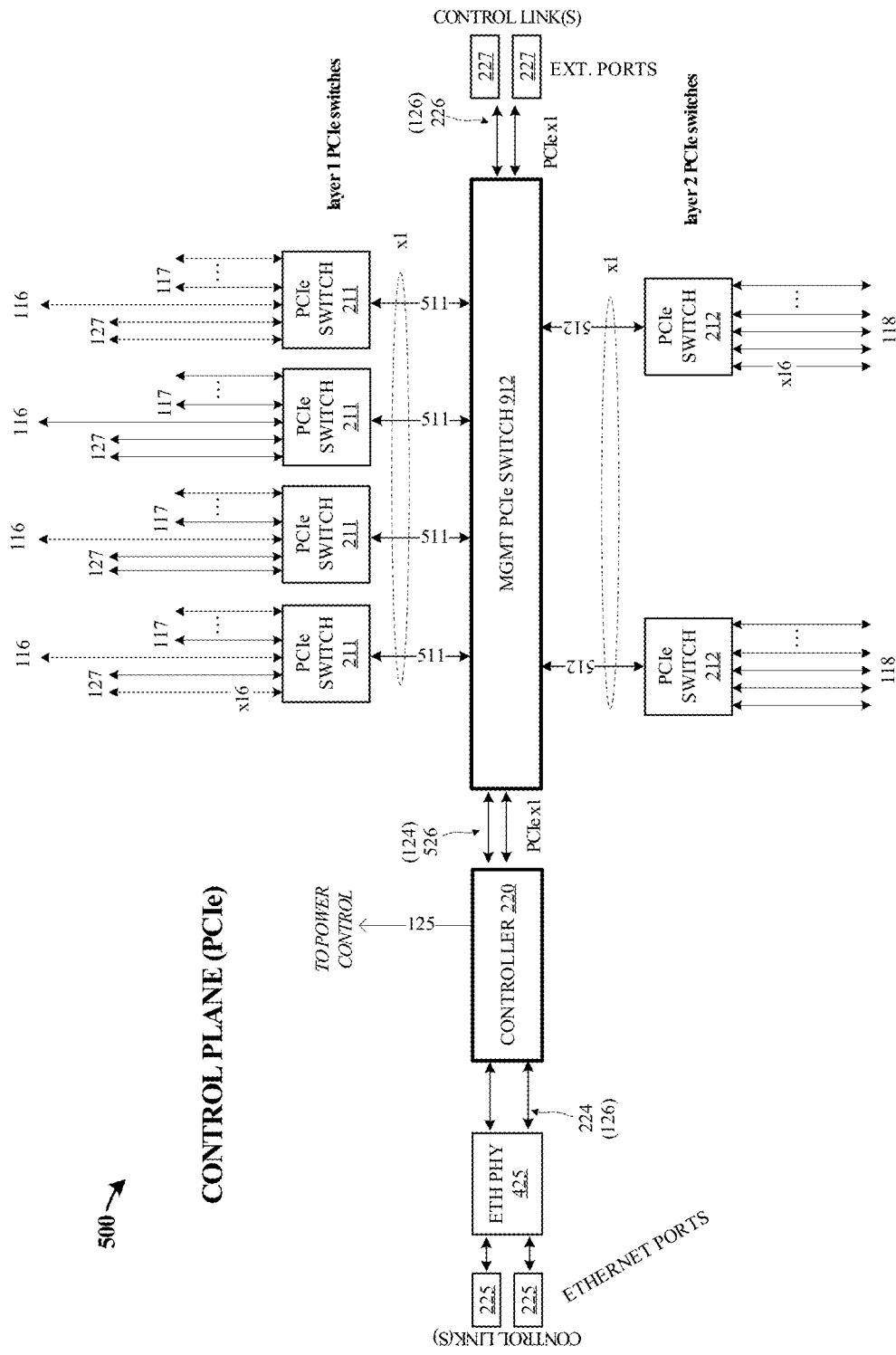
FIG. 5 is a diagram illustrating a control plane for a communication fabric in an implementation.
Figure 6:
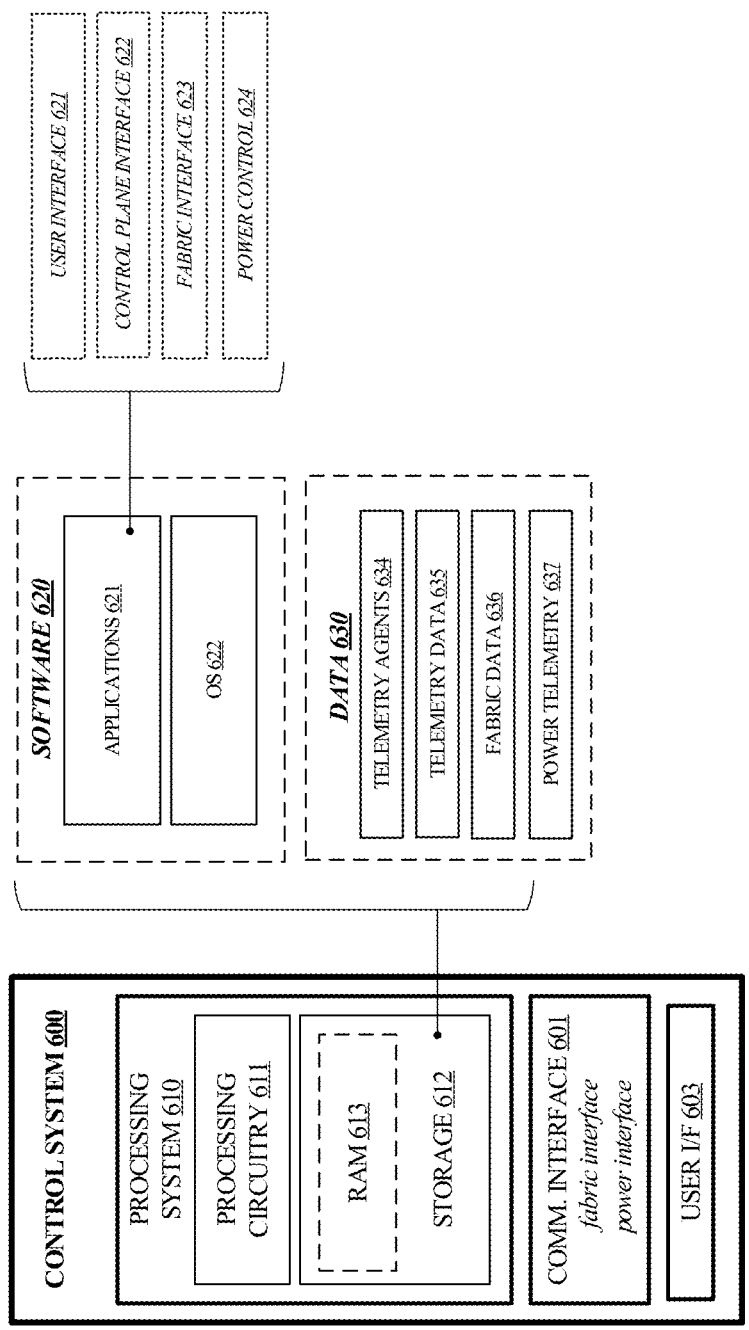
FIG. 6 is a diagram illustrating a control system in an implementation.

To control operations of PCIe switches 211-212, such as to form and dissolve the logical arrangements among links/devices, control system 122 is provided and discussed herein. FIG. 2 illustrates example components of control system 122, although further configurations are shown in FIGS. 4-6. Control system 122 includes controller 220 and communication switch 221 coupled over one or more links 222. Link 222 can comprise Ethernet links, or variations/derivatives thereof, or may instead comprise PCIe links, such as single lane (x1) PCIe links. Communication switch 221 provides fan-out or switched multiplexing for one or more fabric control links 124 which couple to each of PCIe switches 211-212. Control system 122 can control PCIe switches 211-212 over fabric control links 124 and alter the logical partitioning or segregation among PCIe ports and thus alter composition of compute unit groupings of corresponding physical computing components. Fabric control links 124 can comprise either Ethernet-style links (e.g. Serial Gigabit Media Independent Interface (SGMII) or reduced gigabit media-independent interface (RGMII)) or PCIe links, as detailed in FIG. 4-5, but fabric control links 124 are not limited to such link types.

Control system 122 provides link 125 to control power functions of mezzanine board 110, although mezzanine board 110 can include further control systems, logic, and controllers which communicate with controller 220 over link 125. Link 125 can comprise various communication links, such as inter-integrated circuit (I2C) interfaces, System Management Bus (SMBus) interfaces, Power Management Bus (PMBus) interfaces, network interfaces, or other serial or parallel point-to-point or multi-point interfaces discussed herein. Controller 220 also provides for one or more fabric control or management interfaces 126. Control interfaces 126 can include Ethernet-style of interfaces (e.g. SGMII or RGMII) or PCIe compatible interfaces. FIG. 2 shows examples of control interfaces 126, namely PCIe links 226 coupled to external PCIe ports 227 and Ethernet links 224 coupled to external Ethernet PHY/ports 225. The exact arrangement and configuration of links 222-227 can vary based on the type of control plane employed for the PCIe fabric, as shown in FIGS. 4-5.

Controller 220 can comprise one or more microprocessors and other processing circuitry that retrieves and executes software, such as management operating systems, user interfaces, and job interfaces, from an associated storage system. Controller 220 can be implemented within a single processing device but can also be distributed across multiple processing devices or sub-systems that cooperate in executing program instructions. Examples of controller 220 include general purpose central processing units, application specific processors, and logic devices, as well as any other type of processing device, combinations, or variations thereof. In some examples, controller 220 comprises an Intel® or AMD® microprocessor, Apple® microprocessor, ARM® microprocessor, field-programmable gate array (FPGA), application specific integrated circuit (ASIC), application specific processor, or other microprocessor or processing elements.

Figure 3:
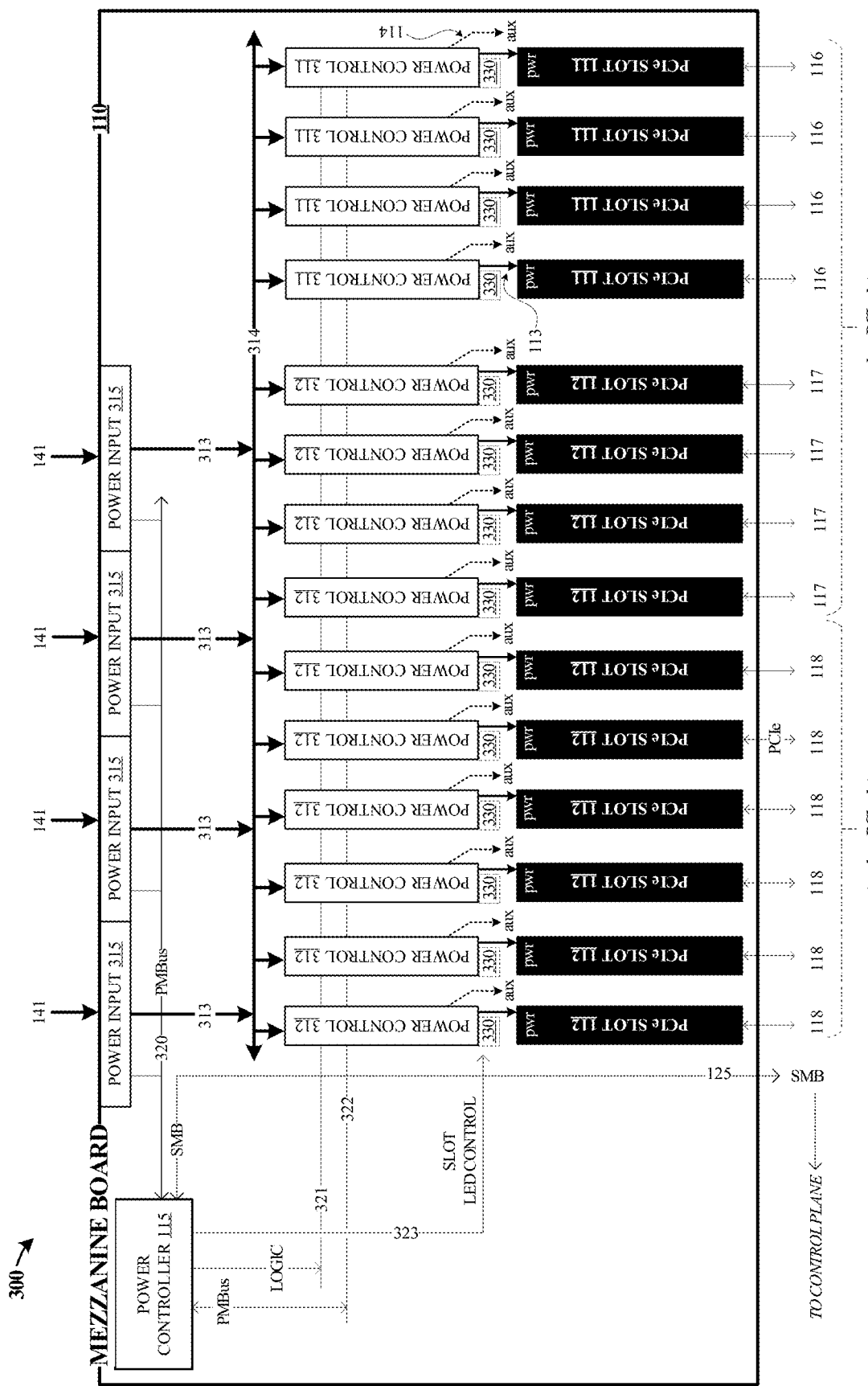
FIG. 3 is a diagram illustrating a mezzanine circuit assembly in an implementation.

Turning now to a discussion on elements of mezzanine board 110, FIG. 3 is presented. FIG. 3 illustrates mezzanine board 110 in configuration 300. Although mezzanine board 110 from FIG. 1 is referenced in FIG. 3 for illustrative purposes, it should be understood that other configurations and arrangements of the associated circuitry can be employed. Mezzanine board 110 includes power controller 115 which is coupled to several instances of power control circuitry 311-312 over links 321-322. In this example, link 321 comprises several instances of discrete links for controlling logic circuitry within each of power control circuitry 311-312. Link 322 comprises PMBus or other serial interfaces which communicate with logic circuitry within each of power control circuitry 311-312. Power controller 115 is also communicatively coupled to several instances of power input circuitry 315 over PMBus 320. Power controller 115 is coupled to slot indicator light control for indicator lights 330 over links 323, which might comprise discrete signal lines or shared serial communication bus lines. Power controller 115 is also optionally coupled to a control plane provided by control system 122 of main board 120 via link 125. In some examples, one or more functions of power controller 115 can be included instead within control system 122.

Power input circuitry 315 receives input power or supply power over power links 141 and performs one or more power conversion or voltage regulation activities, such as step-up or step-down conversions to produce voltages/currents required by PCIe slots. Example voltages include 3.3 VDC and 12 VDC, among others. Power input circuitry 315 can be monitored over link 320, as well as enabled/disabled and configured over link 320 by power controller 115. Power input circuitry 315 provides one or more output voltages over links 313-314 to power control circuitry 311-312 which controls distribution and enabling/disabling of power to individual PCIe slots. Independent power control can be achieved for each of PCIe slots 111-112 to allow for in situ 'live' removal and insertion of selected PCIe expansion cards independent of the powered state of other PCIe expansion cards. Status indicators shown as indicator lights 330 for each slot will display a current state of power as well as other information based on indicator color, on/off status, and selected blinking state/patterns. Power can be disabled for slots that are not presently in use, even if populated with an expansion card. Power control for individual slots can be controlled by control system 122 over link 125 or power controller 115 over links 321-322, including combinations thereof. In operation, a plurality of power links will be energized for individual ones of PCIe slots 111-112 according to such control.

Power control circuitry 311-312 provides power to corresponding PCIe slots 111-112, with this power individually controlled for each PCIe slot. Moreover, power can be applied or removed for each slot while others among the slots are active or powered. To provide this functionality, power control circuitry 311-312 includes circuitry and logic to apply all power inputs to an individual slot concurrently, such that 3.3 VDC and 12 VDC sources are applied concurrently. This can prevent or reduce the likelihood of shorting and power sneaks across power domains of the actual peripheral card inserted into a slot. For example, when one voltage is applied while another remains unapplied, then current might find a path through circuitry or across unrelated power domains on the peripheral card which causes damage to the peripheral card. This concurrent power is applied to 12 VDC which is provided through a slot connector for the corresponding PCIe slot/socket as well as for an auxiliary power connector, if employed. The auxiliary power connector is often employed on peripheral cards that consume large quantities of power and supplements to the 12 VDC supplied through the slot connector itself. Often, GPU peripheral cards consume larger quantities of power than other peripheral cards, and thus require use of an auxiliary power connection. Power control circuitry 311-312 includes logic/circuitry to concurrently apply 12 VDC power to the auxiliary connection (e.g. links 114) and PCIe slot power (e.g. links 113), along with any applicable accessory power or 3.3 VDC power for that slot. Power controller 115 can initiate power on/off events over logic links 321 or via PMBus 322, which may take into account information or control signals provided over link 125.

Current sensing and control is also provided by power control circuitry 311-312. This current sensing, referred to as an electronic fuse or e-fuse, provides limits on the current draw for each slot. This current limit can reduce damage to peripheral cards by preventing too much current being drawn during failure modes or short circuit conditions. Moreover, the e-fuse functionality is resettable, so that power can be re-applied after an e-fuse reset process has been performed by power control circuitry 311-312. The current sensed can be digitized and provided to power controller 115 over PMBus 322 or other means. Slot status indicators are included as slot LEDs 330, and controlled by power controller 115 over link(s) 323. LEDs 330 can indicate present power status, failure status, or other indicators using various combinations of blinking, blinking rates/delays, colors, and other features. Moreover, LEDs 330 can be employed by an operator to obtain knowledge of the slot when servicing a peripheral card. For example, the LED for a slot can indicate when the power of the slot has been removed and a peripheral card can be removed. Each LED can indicate which slots are currently experiencing power issues or failures, so that an operator can quickly determine which peripheral card should be debugged, reset, removed, or replaced.

Other features of power control circuitry 311-312, in combination with power controller 115, include individual slot power control and power status telemetry, auto-power off of individual slots during servicing of peripheral cards within the slots, various reset features, and wake support. The reset features include the ability to hard-cycle power for each slot individually to effect a restart of the associated peripheral card. This hard-cycle included removal of all power to a slot, waiting a predetermined delay, and applying power to the slot. This operation can be performed while other slots remain functional and powered—allowing for individual debug and reset of each slot during operation of the associated computing system.

Physically, each PCIe slot 111-112 comprises a x16 PCIe slot connector. Slot widths can be selected to support single-wide or double-wide PCIe cards, among other widths, including combinations thereof. Auxiliary power connectors/cables are employed for links 114 to supply additional power to each slot/card, as mentioned above. Also, when compatible GPU cards are employed, NVlinks can be used for point-to-point connections among each GPU card separately from the PCIe interfaces.

In operation, physical computing components, such as CPUs, GPUs, NICs, FPGAs, or storage resources can be included on peripheral cards and inserted into any of PCIe slots 111-112. Power control can be achieved for each slot individually to power on or power off one or more of the peripheral cards, allow for hot-swapping of individual cards, and allow for in-situ replacement or servicing of cards. Once populated with a selected set of peripheral cards, PCIe slots 111-112 interface over PCIe interfaces 116-118 to a PCIe fabric and provide physical computing components to a computing cluster. Compute units can be arbitrarily formed among any of the included peripheral cards, and this configuration among cards can be changed to suit present needs of the computing system. Each peripheral card is disaggregated and resides in a pool of unused, unallocated, or free components until allocated (composed) into compute units. A management entity, such as control system 122, can control composition and de-composition of the compute units and provide interfaces to external users, job management software, or orchestration software. Physical computing components can be swapped in and out of compute units and associated clusters on-the-fly, and these resources can be assigned to other compute units or clusters. In one example, AI modules 131 from AI baseboard 130 can be included with GPUs or CPUs populated into PCIe slots 111-112, and can be dispatched/orchestrated for a first computing resource/CPU and subsequently provide graphics processing status/results to another compute unit/CPU. In another example, when resources experience failures, hangs, overloaded conditions, then additional resources can be introduced into the compute units and clusters to supplement the resources.

FIG. 4 is a diagram illustrating control plane 400 for a communication fabric in an implementation. Control plane 400 provides for sideband or out-of-band control over the operation of PCIe switches 211-212 and thus a corresponding PCIe fabric. Control plane 400 provides for secure and encrypted transfer of status/telemetry and command/control signaling into and out of chassis 101 over ports 225. Control plane 400 comprises an Ethernet-based control plane in this example, and a PCIe based example is shown in FIG. 5. Control plane 400 can control the operations and configurations of a PCIe fabric formed from a plurality of PCIe switches, shown in FIGS. 2 and 4 as comprising PCIe switches 211-212. Control plane 400 comprises controller 220 which communicates over control link 426 (124) to Ethernet switch 410 and Ethernet physical layer circuitry (PHY) 425 over links 224 (126). Furthermore, controller 220 can communicate over link 125 to power control elements (not shown in FIG. 4). Ethernet PHY 425 provides at least two Ethernet ports 225 for coupling to Ethernet cabling, such as category-5, 5e, 6, or other suitable types of Ethernet cabling (both conductive and optical) that provide gigabit-class speeds or higher. Link 426 communicatively couples controller 220 to Ethernet switch 410 using a version of Ethernet signaling referred to as Serial Gigabit Media Independent Interface (SGMII) which provides for on-board chip-to-chip communications using Ethernet compatible signaling without the use of cabling or associated PHY circuitry.

Ethernet switch 410 comprises a multi-port switch arrangement to communicatively couple controller 220 to management interfaces of each of PCIe switches 211-212 over associated links 411-412. Links 411-412 comprise reduced gigabit media-independent interface (RGMII) in this example, which provides for on-board chip-to-chip communications using Ethernet compatible signaling without the use of cabling or associated PHY circuitry. Each of PCIe switches 211-212 includes a management port compatible with RGMII communications and allows for control of the various operations of PCIe switches 211-212. For example, assignment and allocation of ports of PCIe switches 211-212 can be controlled over links 411-412 to form sets of ports 116-118 and 127 that are grouped together to form compute units with connected physical computing components. Each of the PCIe links shown in FIG. 4 (116-118, 127) comprise x16 PCIe links, although other configurations of lanes can be employed. Control signaling to control such operations of PCIe switches 211-212 can be received over Ethernet ports 225 for delivery to controller 220 or can be originated by controller 220, among other sources. Controller 220 might interpret signaling or messaging received over link 224 to determine control signaling specific to PCIe switches 211-212 using links 526, 511-512 to interface with and control configurations of PCIe switches 211-212. Moreover, PCIe switches 211-212 can provide status, telemetry, and other messaging to controller 220 over similar interfaces/links. Controller 220 can act on such telemetry/messaging or pass along to further systems over links 224.

FIG. 5 is a diagram illustrating control plane 500 for a communication fabric in an implementation. Control plane 500 provides for sideband PCIe control over the operation of PCIe switches 211-212 and thus a corresponding PCIe fabric. Control plane 500 provides for secure and encrypted transfer of status/telemetry and command/control signaling into and out of chassis 101 over ports 225. Additionally, external PCIe ports/links 227 are provided in control plane 500 which can provide similar features as ports 225. Control plane 500 comprises a PCIe-based control plane in this example. Control plane 500 can control the operations and configurations of a PCIe fabric formed from a plurality of PCIe switches, shown in FIGS. 2 and 5 as comprising PCIe switches 211-212. Control plane 500 comprises controller 220 which communicates over control link 526 (124) to management PCIe switch 510 and Ethernet physical layer circuitry (PHY) 425 over links 224 (126). Furthermore, controller 220 can communicate over link 125 to power control elements (not shown in FIG. 5). Ethernet PHY 425 provides at least two Ethernet ports 225 for coupling to Ethernet cabling, such as category-5, 5e, 6, or other suitable types of Ethernet cabling (both conductive and optical) that provide gigabit-class speeds or higher. Link 526 communicatively couples controller 220 to management PCIe switch 510 using x1 PCIe links, although other PCIe widths are possible.

Management PCIe switch 510 comprises a multi-port PCIe switch, similar in configuration as PCIe switches 211-212, but configured in a x1 link width arrangement to communicatively couple controller 220 to management interfaces of each of PCIe switches 211-212 over associated links 511-512. Links 511-512 comprise x1 PCIe links in this example. Each of PCIe switches 211-212 includes a management port compatible with PCIe communications and allows for control of the various operations of PCIe switches 211-212. For example, assignment and allocation of ports of PCIe switches 211-212 can be controlled over links 511-512 to form sets of ports 116-118 and 127 that are grouped together to form compute units with connected physical computing components. Each of the PCIe links shown in FIG. 5 (116-118, 127) comprise x16 PCIe links, although other configurations of lanes can be employed. Control signaling to control such operations of PCIe switches 211-212 can be received over Ethernet ports 225 for delivery to controller 220 or can be originated by controller 220, among other sources. Controller 220 might interpret signaling or messaging received over link 224 to determine control signaling specific to PCIe switches 211-212 using links 526, 511-512 to interface with and control configurations of PCIe switches 211-212. Moreover, PCIe switches 211-212 can provide status, telemetry, and other messaging to controller 220 over similar interfaces/links. Controller 220 can act on such telemetry/messaging or pass along to further systems over links 224. Additionally, external PCIe ports/links 227 are provided in control plane 500 to provide similar features/functionality as ports/links 225, but over PCIe style of links instead of Ethernet.

In the arrangement shown in FIG. 5, out-of-band control and telemetry can be carried over Ethernet signaling over links 224, and orchestration of compute unit formation via port configuration of PCIe switches 211-212 can be controlled over links 226. The PCIe based control plane of FIG. 5 enables flexibility to manage each individual PCIe switch 211-212 via controller 220 (internal to chassis 101) or via external management nodes coupled over PCIe and links 226.

FIG. 6 is a block diagram illustrating an implementation of control system 600. Control system 600 illustrates an example of any of the control systems, controllers, or management processors discussed herein, such as control system 110 of FIG. 1, controller 220 of FIGS. 2, 4, and 5, or power controller 115 of FIGS. 1 and 3. Control system 600 includes communication interface(s) 601, user interface 603, and processing system 610. Processing system 610 includes processing circuitry 611 and data storage system 612 which can include random access memory (RAM) 613, although additional or different configurations of elements can be included.

Processing circuitry 611 can be implemented within a single processing device but can also be distributed across multiple processing devices or sub-systems that cooperate in executing program instructions. Examples of processing circuitry 611 include general purpose central processing units, microprocessors, application specific processors, and logic devices, as well as any other type of processing device. In some examples, processing circuitry 611 includes physically distributed processing devices, such as cloud computing systems.

Communication interface 601 includes one or more communication and network interfaces for communicating over communication links, networks, such as packet networks, the Internet, and the like. The communication interfaces can include PCIe interfaces, Ethernet interfaces, serial interfaces, serial peripheral interface (SPI) links, I2C interfaces, universal serial bus (USB) interfaces, SMBus interfaces, PMBus interfaces, UART interfaces, wireless interfaces, or one or more local or wide area network communication interfaces which can communicate over Ethernet, Ethernet-style, or Internet protocol (IP) links. Communication interface 601 can include network interfaces configured to communicate using one or more network addresses, which can be associated with different network links. Examples of communication interface 601 include network interface card equipment, transceivers, modems, and other communication circuitry. Communication interface 601 can communicate with elements of a PCIe fabric or other communication fabric to establish logical partitioning within the fabric, such as over an administrative or control interface of one or more communication switches of the communication fabric.

User interface 603 may include a touchscreen, keyboard, mouse, voice input device, audio input device, or other touch input device for receiving input from a user. Output devices such as a display, speakers, web interfaces, terminal interfaces, and other types of output devices may also be included in user interface 603. User interface 603 can provide output and receive input over a network interface, such as communication interface 601. In network examples, user interface 603 might packetize display or graphics data for remote display by a display system or computing system coupled over one or more network interfaces. Physical or logical elements of user interface 603 can provide alerts or visual outputs to users or other operators. User interface 603 may also include associated user interface software executable by processing system 610 in support of the various user input and output devices discussed above. Separately or in conjunction with each other and other hardware and software elements, the user interface software and user interface devices may support a graphical user interface, a natural user interface, or any other type of user interface.

User interface 603 can present a graphical user interface (GUI) to one or more users. The GUI can be employed by end users or administrators to establish clusters, assign assets (compute units/machines) to each cluster. In some examples, the GUI or other portions of user interface 603 provides an interface to allow an end user to determine one or more compute unit templates and dynamic adjustment policy sets to use or customize for use in creation of compute units. User interface 603 can be employed to manage, select, and alter machine templates or alter policies for compute units. User interface 603 also can provide telemetry information, such as in one or more status interfaces or status views. The state of various components or elements can be monitored through user interface 603, such as processor/CPU state, network state, storage unit state, PCIe element state, among others. Various performance metrics, error statuses can be monitored using user interface 603. User interface 603 can provide other user interfaces than a GUI, such as command line interfaces (CLIs), application programming interfaces (APIs), or other interfaces. Portions of user interface 603 can be provided over a Web Socket based interface. User interface 603 can provide or control physical indicator lights, such as those discussed herein, or provide status/information/control over one or more front-panel displays on a chassis or enclosure-mounted display.

Storage system 612 and RAM 613 together can comprise a non-transitory data storage system, although variations are possible. Storage system 612 and RAM 613 can each comprise any storage media readable by processing circuitry 611 and capable of storing software and OS images. RAM 613 can include volatile and nonvolatile, removable and non-removable media implemented in any method or technology for storage of information, such as computer readable instructions, data structures, program modules, or other data. Storage system 612 can include non-volatile storage media, such as solid-state storage media, flash memory, phase change memory, or magnetic memory, including combinations thereof. Storage system 612 and RAM 613 can each be implemented as a single storage device but can also be implemented across multiple storage devices or sub-systems. Storage system 612 and RAM 613 can each comprise additional elements, such as controllers, capable of communicating with processing circuitry 611.

Software or data stored on or in storage system 612 or RAM 613 can comprise computer program instructions, firmware, or some other form of machine-readable processing instructions having processes that when executed a processing system direct control system 600 to operate as described herein. Software 620 illustrates a detailed view of an example configuration of storage 612 or RAM 613. It should be understood that different configurations are possible. Software 620 includes applications 621 and operating system (OS) 622. Software applications each comprise executable instructions which can be executed by control system 600 for operating a computing system or cluster controller or operating other circuitry according to the operations discussed herein.

For example, software 620 can drive control system 600 to receive user commands to establish compute units among a plurality of disaggregated physical computing components that include CPUs, GPUs, SSDs, and NICs, among other components. These components comprise any component inserted into a PCIe peripheral slot, PCIe-based storage drive connector, or AI module discussed herein. Software 620 can drive control system 600 to receive and monitor telemetry data, statistical information, operational data, and other data to provide telemetry to users and alter operation of compute units according to the telemetry data, policies, or other data and criteria. Software 620 can drive control system 600 to manage cluster resources and compute unit resources, establish domain partitioning or NT partitioning among communication fabric elements, and interface with individual communication switches to control operation of such communication switches, among other operations. The software can also include user software applications, application programming interfaces (APIs), or user interfaces. The software can be implemented as a single application or as multiple applications. In general, the software can, when loaded into a processing system and executed, transform the processing system from a general-purpose device into a special-purpose device customized as described herein.

Control plane interface 622 provides communication among other control system 600 elements, such as over I2C, SMBus, PMBus, discrete logic signaling, Ethernet, emulated network devices, or PCIe interfaces. Control plane interface 622 enables communications between control system 600, control plane circuitry, and power control circuitry, as well as other elements. Fabric interface 623 communicates with management/control interfaces of PCIe switch circuitry and establishes various logical partitioning or domains among communication fabric circuit elements, such as PCIe switch elements of a PCIe fabric. Fabric interface 623 also controls operation of fabric switch elements, and receives telemetry from fabric switch elements. Fabric interface 623 also establishes address traps or address redirection functions within a communication fabric. Fabric interface 623 can interface with one or more fabric switch circuitry elements to establish address ranges which are monitored and redirected, thus forming address traps in the communication fabric.

In addition to software 620, other data 630 can be stored by storage system 612 and RAM 613. Data 630 can comprise telemetry agents 634, telemetry data 635, and fabric data 636. Telemetry agents 634 can include software elements which can be deployed to components in compute units for monitoring the operations of compute units. Telemetry agents 634 can include hardware/software parameters, telemetry device addressing, or other information used for interfacing with monitoring elements, such as IPMI-compliant hardware/software of compute units and communication fabrics. Telemetry data 635 comprises a data store of received data from telemetry elements of various compute units, where this received data can include telemetry data or monitored data. Telemetry data 635 can organize the data into compute unit arrangements, communication fabric arrangements or other structures. Telemetry data 635 might be cached as data 630 and subsequently transferred to other elements of a computing system or for use in presentation via user interfaces. Fabric data 636 includes information and properties of the various communication fabrics that comprise a pool of resources or pool of components, such as fabric type, protocol version, technology descriptors, header requirements, addressing information, and other data. Fabric data 636 might include relations between components and the specific fabrics through which the components connect.

Power control can also be achieved with control system 600, such as that found in power controller 115. Power control 624 provides for control algorithms and schemes which provide for monitoring of PCIe slot power, initiating status indicators to various user interface elements associated with PCIe slots and associated chassis, and control over slot power, among other operations. Power telemetry 637 can store status of chassis power and slot power for individual peripheral slots, indicating current consumption, power on/off status, and card insertion status. Based on this status, power control 624 can alter power on/off status for individual peripheral slots or chassis internal circuit boards, as well as provide for control over power indicator lights/LEDs or front-panel displays (if employed). Furthermore, web interfaces, terminal interfaces, APIs, or command-line interfaces can be provided by power control 624 to send/receive power status/control to external systems, as described by user interface 603.

Software 620 can reside in RAM 613 during execution and operation of control system 600, and can reside in non-volatile portions of storage system 612 during a powered-off state, among other locations and states. Software 620 can be loaded into RAM 613 during a startup or boot procedure as described for computer operating systems and applications. Software 620 can receive user input through user interface 603. This user input can include user commands, as well as other input, including combinations thereof.

Storage system 612 can comprise flash memory such as NAND flash or NOR flash memory, phase change memory, magnetic memory, among other solid-state storage technologies. As shown in FIG. 6, storage system 612 includes software 620. As described above, software 620 can be in a non-volatile storage space for applications and OS during a powered-down state of control system 600, among other operating software.

Control system 600 is generally intended to represent a computing system with which at least software 620 is deployed and executed in order to render or otherwise implement the operations described herein. However, control system 600 can also represent any computing system on which at least software 620 can be staged and from where software 620 can be distributed, transported, downloaded, or otherwise provided to yet another computing system for deployment and execution, or yet additional distribution.

Figure 7:
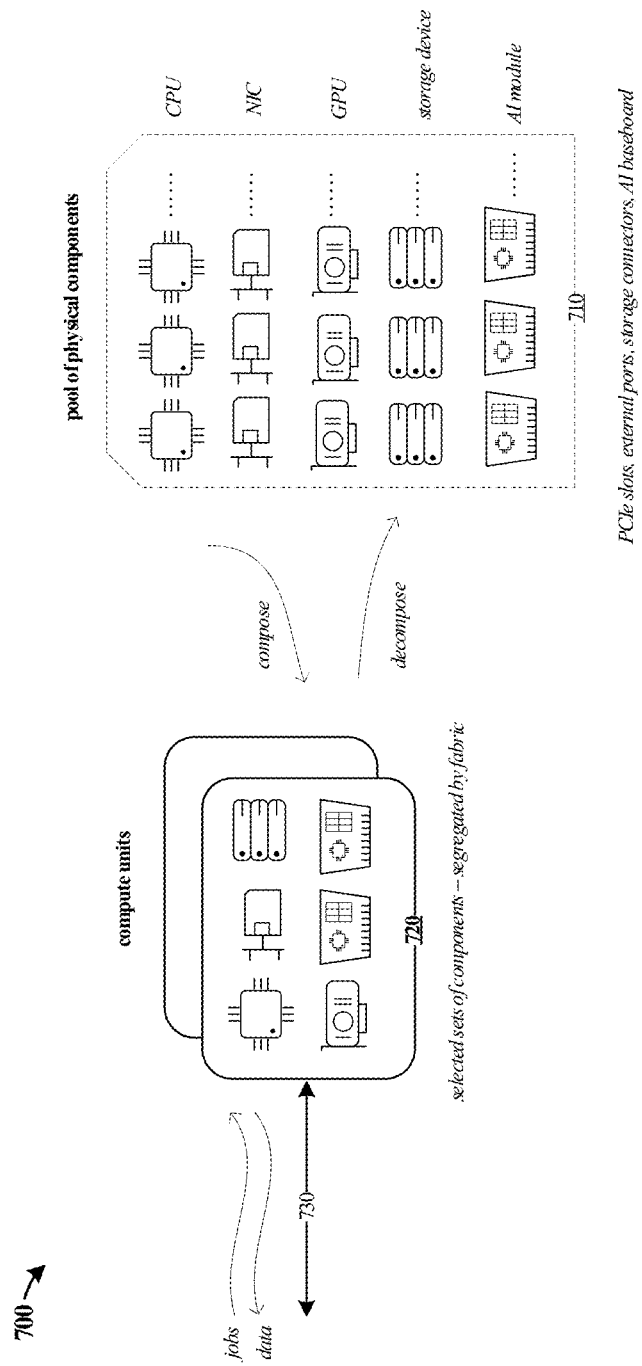
FIG. 7 is a diagram illustrating compute unit formation in an implementation.

FIG. 7 includes operational diagram 700 illustrating compute unit formation in an implementation. As mentioned herein, compute units can be formed as groupings of physical computing components which are logically segregated among domains or ports of a communication fabric. These physical computing components can be populated into PCIe slots or various PCIe compatible storage connectors, such as those shown in FIGS. 1 and 3, and may include CPUs, GPUs, data storage devices, NVMe devices, FPGAs, CoPUs, NICs, InfiniBand bridges/couplers, or other various components. These physical computing components also can include a plurality of AI modules, such as those shown for AI modules 131 in FIG. 1. Thus, compute units can include one or more AI modules, one or more CPUs, GPUs, data storage devices, FPGAs, CoPUs, NICs, InfiniBand bridges/couplers, or other various components.

A pool of free physical computing components can be formed, from which physical computing components can be selected for use when establishing compute units. This describes a disaggregated computing system, where a pool of physical computing components are disaggregated form each other until composed into arbitrary compute units. FIG. 7 shows this free pool 710 which comprises representative instances of the various physical computing components discussed above. One or more data structures can be maintained by a management element, such as by control system 122 or any suitable external management element external to chassis 101 and coupled over an external PCIe interface (123). These data structures can include listings of physical computing components, status indicators (free, used, offline, online, assigned compute unit identifier).

An example compute unit 720 can be created, or composed, from among available physical computing components from pool 710. Compute unit 720 includes two AI modules, one CPU, one GPU, one NIC, and one storage device. Other compute units can be formed from remaining physical computing components in pool 710. Compute unit 720 can communicate with further elements, such as management entities, network devices, hosts, users, or other entities over compute unit interface 730. Compute unit interface 730 might comprise a network link provided by a corresponding NIC of compute unit 720, such as a gigabit Ethernet link. Over compute unit interface 730, job data, applications, data, or other software/data elements can be transferred to components of compute unit 720 for processing. For example, a data processing job, along with associated data sets, can be transferred over compute unit interface 730 to compute unit 720 for processing using the associated AI modules and GPU which are controlled by the associated CPU. Corresponding data can be stored and swapped to the associated storage device of compute unit 720, and completed data sets, status, and telemetry can be transferred over compute unit interface 730 by the associated NIC.

Compute unit interface 730 can further comprise network interfaces, user interfaces, terminal interfaces, application programming interfaces (APIs), Representational state transfer (REST) interfaces, RESTful interfaces, RestAPIs, among other interfaces. In some examples, a workload manager software platform (not shown) establishes a front-end for users or operators from which jobs can be created, scheduled, and transferred for execution or handling. Compute unit interface 730 can receive indications of these jobs from a workload manager software platform or a cluster management application which establishes and maintains clusters and compute units among various hardware elements of a computing platform. Job handling applications receive execution jobs over compute unit interface 730, and determines indicated job software or data needed to be deployed to the compute unit for execution of the jobs, as well as what data, status, or results are needed to be transferred over compute unit interface 730 to originating systems upon completion of the jobs.

For sake of an operational example, control system 122 from FIG. 1, composes compute units to support execution jobs according to schedules and properties indicated in a job. Control system 122 initiates the execution jobs on computing system 100 according to the resource scheduling by at least instructing a communication fabric associated with a pool (710) of physical computing components to compose compute units comprising sets of physical computing components selected from among the pool to handle the execution jobs. Instructing the communication fabric to compose the compute units comprises instructing the communication fabric over control link(s) 124 to form logical isolations within the communication fabric communicatively coupling the selected sets or groups of physical computing components. The logical isolations each allow physical computing components within each of the sets to communicate over the communication fabric only within corresponding logical isolations. Control system 122 controls the communication fabric for deployment of software components to the compute units for executing the jobs once each of the physical compute units are formed and provides for booting of associated CPU elements. Then, the composed compute units execute corresponding jobs on the composed compute units. Finally, once the execution jobs are complete, control system 122 decomposes resources of associated compute units back to pool 710. Prior to decomposition, various results from the job can be transferred to a workload manager or other external entity by the compute unit. These results can include data sets which have been processed, status on completion, or other data which has been executed, handled, manipulated, or otherwise deployed to the compute unit. To perform the de-composition, control system 122 instructs the communication fabric to remove a corresponding logical isolation for the physical compute units such that computing components of the compute units are made available for composition into additional physical compute units.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the present disclosure. Those skilled in the art will also appreciate that the features described above can be combined in various ways to form multiple implementations. As a result, the invention is not limited to the specific implementations described above, but only by the claims and their equivalents.

What is claimed is:

1. A method comprising:
coupling into a communication fabric a plurality of communication interfaces provided by a baseboard hosting a plurality data processing devices;
establishing a one-hop latency in the communication fabric between the plurality of data processing devices and peripheral card slots;
establishing a two-hop latency in the communication fabric between the plurality of data processing devices and additional peripheral card slots; and
establishing interconnect pathways between individual ones of a plurality of communication switches that provide the one-hop latency through one or more cross-connect communication switches that provide the two-hop latency.

2. The method of claim 1, further comprising:
on a circuit board comprising the plurality of communication switches and the one or more cross-connect communication switches, providing fabric signaling associated with the peripheral card slots and the additional peripheral card slots to an additional circuit board that comprises the peripheral card slots, the additional peripheral card slots, and power circuitry for the peripheral card slots and the additional peripheral card slots.

3. The method of claim 2, wherein one or more of the peripheral card slots are populated with storage devices and have the one-hop latency in the communication fabric with regards to the plurality of data processing devices.

4. The method of claim 1, wherein the plurality of communication switches each comprise first ports coupled to the communication interfaces, second ports coupled to the peripheral card slots, third ports coupled to the one or more cross-connect communication switches, and fourth ports coupled to sockets providing external communication links for a corresponding chassis that houses the plurality of communication switches.

5. The method of claim 1, wherein the communication fabric comprises at least one among a Peripheral Component Interconnect Express (PCIe) fabric and Compute Express Link (CXL) fabric, and wherein the plurality of communication interfaces provided by a baseboard comprise at least one among PCIe interfaces and CXL interfaces.

6. The method of claim 1, wherein the plurality data processing devices comprise one or more among graphics processing units (GPUs), central processing units (CPUs), co-processing units (CoPUs), tensor processing units (TPUs), and field-programmable gate arrays (FPGAs).

7. The method of claim 1, wherein the plurality data processing devices comprise graphics processing units (GPUs) coupled to each other over communication interconnect separate from the plurality of communication interfaces.

8. The method of claim 1, further comprising:
providing individual power control for each of the peripheral card slots that supports powering down individual ones of the peripheral card slots while others among the peripheral card slots remain powered and operational.

9. The method of claim 1, further comprising:
providing a control arrangement for the communication fabric comprising ethernet connections to each of the plurality of communication switches and the one or more cross-connect communication switches, wherein the control arrangement allows for initiation of logical partitioning within the communication fabric among ports provided by the plurality of communication switches and the one or more cross-connect communication switches.

10. The method of claim 1, further comprising:
in a control communication switch, providing a control arrangement for the communication fabric comprising Peripheral Component Interconnect Express (PCIe) connections to each of the plurality of communication switches and the one or more cross-connect communication switches, wherein the control arrangement allows for initiation of logical partitioning within the communication fabric among ports provided by the plurality of communication switches and the one or more cross-connect communication switches.

11. A system comprising:
a communication fabric configured to couple to a plurality of communication interfaces provided by a baseboard hosting a plurality data processing devices;
wherein a one-hop latency is established in the communication fabric between the plurality of data processing devices and peripheral card slots;
wherein a two-hop latency is established in the communication fabric between the plurality of data processing devices and additional peripheral card slots; and
wherein interconnect pathways are established between individual ones of a plurality of communication switches that provide the one-hop latency through one or more cross-connect communication switches that provide the two-hop latency.

12. The system of claim 11, comprising:
a circuit board comprising the plurality of communication switches and the one or more cross-connect communication switches, wherein the circuit board is configured to provide fabric signaling associated with the peripheral card slots and the additional peripheral card slots to an additional circuit board that comprises the peripheral card slots, the additional peripheral card slots, and power circuitry for the peripheral card slots and the additional peripheral card slots.

13. The method of claim 12, wherein one or more of the peripheral card slots are populated with storage devices and have the one-hop latency in the communication fabric with regard to the plurality of data processing devices.

14. The system of claim 11, wherein the plurality of communication switches each comprise first ports coupled to the communication interfaces, second ports coupled to the peripheral card slots, third ports coupled to the one or more cross-connect communication switches, and fourth ports coupled to sockets providing external communication links for a corresponding chassis that houses the plurality of communication switches.

15. The system of claim 11, wherein the communication fabric comprises at least one among a Peripheral Component Interconnect Express (PCIe) fabric and a Compute Express Link (CXL) fabric, and wherein the plurality of communication interfaces provided by a baseboard comprise at least one among PCIe interfaces and CXL interfaces.

16. The system of claim 11, wherein the plurality data processing devices comprise graphics processing units (GPUs) coupled to each other over communication interconnect separate from the plurality of communication interfaces.

17. The system of claim 11, comprising:
power control for each of the peripheral card slots that supports powering down individual ones of the peripheral card slots while others among the peripheral card slots remain powered and operational.

18. The system of claim 11, further comprising:
a control arrangement for the communication fabric comprising ethernet connections to each of the plurality of communication switches and the one or more cross-connect communication switches, wherein the control arrangement allows for initiation of logical partitioning within the communication fabric among ports provided by the plurality of communication switches and the one or more cross-connect communication switches.

19. The system of claim 11, further comprising:
a control communication switch configured to provide a control arrangement for the communication fabric comprising Peripheral Component Interconnect Express (PCIe) connections to each of the plurality of communication switches and the one or more cross-connect communication switches, wherein the control arrangement allows for initiation of logical partitioning within the communication fabric among ports provided by the plurality of communication switches and the one or more cross-connect communication switches.

20. A computing arrangement, comprising:
a Peripheral Component Interconnect Express (PCIe) fabric configured to provide a one-hop latency between a first plurality of PCIe interfaces and a second plurality of PCIe interfaces;
the PCIe fabric configured to provide a two-hop latency between the first plurality of PCIe interfaces and a third plurality of PCIe interfaces;
wherein interconnect pathways are established between individual ones of PCIe switches that provide the one-hop latency through one or more cross-connect PCIe switches that provide the two-hop latency; and
a control arrangement for the PCIe fabric configured to establish groupings among selected ones of the first plurality of PCIe interfaces, the second plurality of PCIe interfaces, and the third plurality of PCIe interfaces, wherein the groupings form compute units each having PCIe communications segregated within the PCIe fabric from each other.

* * * * *